(12) United States Patent
Motai

(10) Patent No.: US 7,443,270 B2
(45) Date of Patent: Oct. 28, 2008

(54) FILM BULK ACOUSTIC RESONATOR, FILTER CIRCUIT AND METHOD FOR MANUFACTURING A FILM BULK ACOUSTIC RESONATOR

(75) Inventor: Takako Motai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 11/487,366

(22) Filed: Jul. 17, 2006

(65) Prior Publication Data

US 2007/0024395 A1    Feb. 1, 2007

(30) Foreign Application Priority Data

Jul. 28, 2005    (JP)    ............... 2005-218937

(51) Int. Cl.
*H03H 9/54* (2006.01)
(52) U.S. Cl. ............... 333/187; 333/189; 333/133; 310/312; 310/320
(58) Field of Classification Search ......... 333/187–189, 333/133; 310/320, 324, 349
See application file for complete search history.

(56) References Cited

U.S. PATENT DOCUMENTS

| 6,794,958 | B2* | 9/2004 | Philliber et al. ............. 333/189 |
| 6,885,260 | B2* | 4/2005 | Nishimura et al. .......... 333/133 |
| 6,954,121 | B2* | 10/2005 | Bradley et al. .............. 333/187 |
| 7,129,806 | B2* | 10/2006 | Sato ........................... 333/187 |
| 7,253,703 | B2* | 8/2007 | Song et al. ................... 333/133 |
| 7,253,705 | B2* | 8/2007 | Song et al. ................... 333/187 |
| 7,358,831 | B2* | 4/2008 | Larson et al. ................ 333/187 |
| 7,372,346 | B2* | 5/2008 | Tilmans et al. .............. 333/187 |
| 2003/0179053 | A1* | 9/2003 | Aigner et al. ............... 333/189 |
| 2004/0246075 | A1* | 12/2004 | Bradley et al. .............. 333/187 |

FOREIGN PATENT DOCUMENTS

| JP | 2000-69594 | 3/2000 |
| JP | 2004-17171 | 1/2004 |
| JP | 2004-111767 | 4/2004 |

* cited by examiner

*Primary Examiner*—Vibol Tan
(74) *Attorney, Agent, or Firm*—Oblon, Spivak, McClelland, Maier & Neustadt, P.C.

(57) ABSTRACT

A film bulk acoustic resonator includes a substrate having a cavity at a surface of the substrate; a bottom electrode provided on the surface of the substrate so as to extend over the cavity; a piezoelectric film disposed on the bottom electrode; a top electrode disposed on the piezoelectric film so as to face the bottom electrode and extending over the surface of the substrate; and a seal member configured to seal a capacitor defined by the bottom electrode, the piezoelectric film and the top electrode, and to provide an opening portion of the cavity outside the seal member at the surface of the substrate.

20 Claims, 13 Drawing Sheets

US 7,443,270 B2

FILM BULK ACOUSTIC RESONATOR, FILTER CIRCUIT AND METHOD FOR MANUFACTURING A FILM BULK ACOUSTIC RESONATOR

CROSS REFERENCE TO RELATED APPLICATIONS AND INCORPORATION BY REFERENCE

This application is based upon and claims the benefit of priority from prior Japanese Patent Application P2005-218937 filed on Jul. 28, 2005; the entire contents of which are incorporated by reference herein.

BACKGROUND OF THE INVENTION

1. Field of the Invention

The present Invention relates to a film bulk acoustic resonator having a cavity, a filter circuit and a method for manufacturing a film bulk acoustic resonator.

2. Description of the Related Art

Wireless technology has achieved remarkable development, and further development targeting high-speed wireless transmission is now in progress. At the same time, higher frequencies are more readily attainable, along with increases in the amount of transmittable information. With respect to more highly functional mobile wireless devices, there are strong demands for smaller and lighter components, and components, such as filters previously embedded as discrete components, are being integrated.

In light of these developments, one of the components drawing attention in recent years is a filter utilizing a film bulk acoustic resonator (FBAR). The FBAR is a resonator using a resonance phenomenon of a piezoelectric material, similar to a surface acoustic wave (SAW) element. The FBAR is more suitable for a high frequency operation above 2 GHz, whereas a SAW element has problems handling the relevant frequency range. Since the FBAR uses the resonance of longitudinal waves in the thickness direction of a piezoelectric film, it is possible to drastically reduce the size of the element, especially the thickness thereof. In addition, it is relatively easy to fabricate the FBAR on a semiconductor substrate, such as silicon (Si). Accordingly, the FBAR can be easily integrated into a semiconductor chip.

The FBAR is provided with cavities above and below a capacitor, in which a piezoelectric film is sandwiched between a top electrode and a bottom electrode. A typical FBAR has a stacked structured of a bottom electrode, a piezoelectric film, and a top electrode on a cavity provided above a Si substrate (refer to Japanese Unexamined Patent Publication No. 2000-69594).

In a general method for manufacturing a FBAR, for example, a groove formed in the substrate is filled with a sacrificial material, and a capacitor of the FBAR is formed on the sacrificial material. The sacrificial material is selectively removed by selective etching to form a bottom cavity. Thereafter, the capacitor is sealed using a resin film and the like so as to provide a top cavity between the resin film and the capacitor. Generally, aluminum nitride (AlN) or zinc nitride (ZnO) is used as the piezoelectric film.

In a sealing process of the top cavity, the thermal load or a weight load is applied by adhesion of the resin film. Collapse of the bottom cavity immediately below the capacitor may occur. As a result, the yield rate for manufacturing a FBAR is decreased.

A resonant frequency is primarily determined by an acoustic velocity of the piezoelectric film and thicknesses of the piezoelectric film and the electrodes, such as the top and bottom electrodes. The acoustic velocity is a characteristic value peculiar to the material of the piezoelectric film. Therefore, the resonant frequency of the FBAR is adjusted by changing the thicknesses of the piezoelectric film and the electrodes. In other words, the resonant frequency of the FBAR is extremely affected by the thicknesses of the piezoelectric film and the electrodes.

For example, in a resonant frequency range of around 2 GHz, a variation of about 1% in the thickness of the piezoelectric film or the electrodes affects a variation of about 1% in the resonant frequency. In an application to a filter circuit, in order to attain desired filtration properties, it is necessary to suppress the variation of the resonant frequency to be about 1% or less. Therefore, there is a demand to suppress variations in thickness during deposition of each of the piezoelectric film and the electrodes.

However, variations in thickness during deposition is limited by performance of a deposition apparatus. Thus, it is difficult to decrease the variations in thickness during deposition. In actuality, it is difficult to suppress the resonant frequency within a permissible range of variation. Therefore, the resonant frequency is adjusted by trimming the electrodes, in which the thickness of the top and bottom electrodes is adjusted, after formation of the capacitor.

Although there are numerous different trimming methods, in all cases, the thicknesses of the electrodes are adjusted before sealing of the top cavity above the capacitor. However, the resonant frequency of the FBAR may vary because of processes after sealing of the top cavity. Thus, the yield rate for manufacturing a FBAR is decreased.

SUMMARY OF THE INVENTION

A first aspect of the present invention inheres in a film bulk acoustic resonator including a substrate having a cavity at a surface of the substrate; a bottom electrode provided on the surface of the substrate so as to extend over the cavity; a piezoelectric film disposed on the bottom electrode; a top electrode disposed on the piezoelectric film so as to face the bottom electrode and extending over the surface of the substrate; and a seal member configured to seal a capacitor defined by the bottom electrode, the piezoelectric film and the top electrode, and to provide an opening portion of the cavity outside the seal member at the surface of the substrate.

A second aspect of the present invention inheres in a filter circuit using a plurality of electrically connected film bulk acoustic resonators on a substrate, each of the film bulk acoustic resonators including a bottom electrode provided on a surface of the substrate having a cavity at the surface of the substrate so as to extend over the cavity; a piezoelectric film disposed on the bottom electrode; a top electrode disposed on the piezoelectric film so as to face the bottom electrode and extending over the surface of the substrate; and a seal member configured to seal a capacitor defined by the bottom electrode, the piezoelectric film and the top electrode, and to provide an opening portion of the cavity outside the seal member at the surface of the substrate.

A third aspect of the present invention inheres in a method for manufacturing a film bulk acoustic resonator including selectively forming a sacrificial film in and at a surface of a substrate; delineating a bottom electrode on the surface of the substrate so as to extend over the sacrificial film; delineating a piezoelectric film on the bottom electrode; delineating a top electrode on the piezoelectric film so that a part of the top electrode faces the bottom electrode and another part of the top electrode extends over the surface of the substrate; forming a support member on the substrate so as to surround a capacitor defined by the bottom electrode, the piezoelectric film and the top electrode and to locate a portion of the sacrificial film outside a surrounded region of the support member; attaching a seal plate on the support member above the capacitor so as to seal the capacitor; and forming a cavity at the surface of the substrate by removing the sacrificial film through the portion of the sacrificial film located outside the surrounded region of the support member.

DETAILED DESCRIPTION OF THE INVENTION

Figure 1:
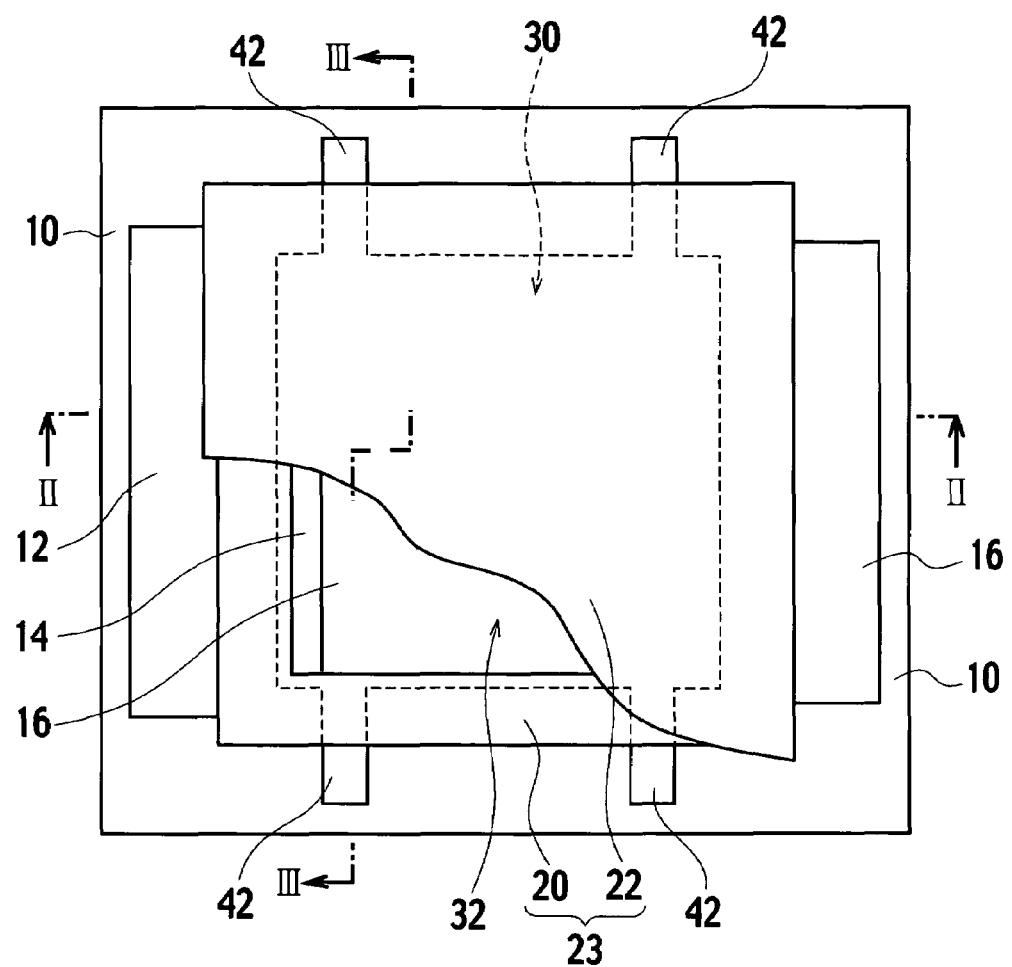
FIG. 1 is a plan view showing an example of a FBAR according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2:
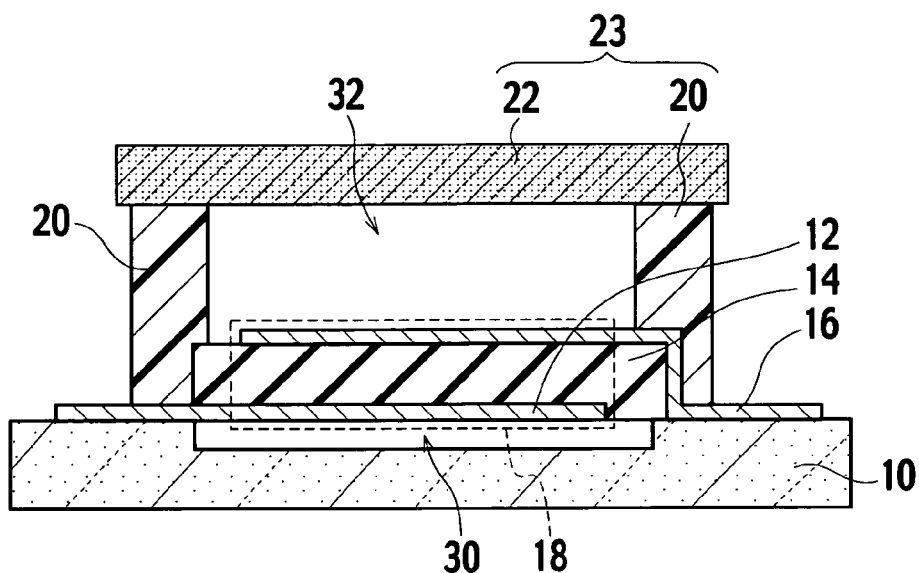
FIG. 2 is cross-sectional view taken on line II-II of the FBAR shown in FIG. 1.
Figure 3:
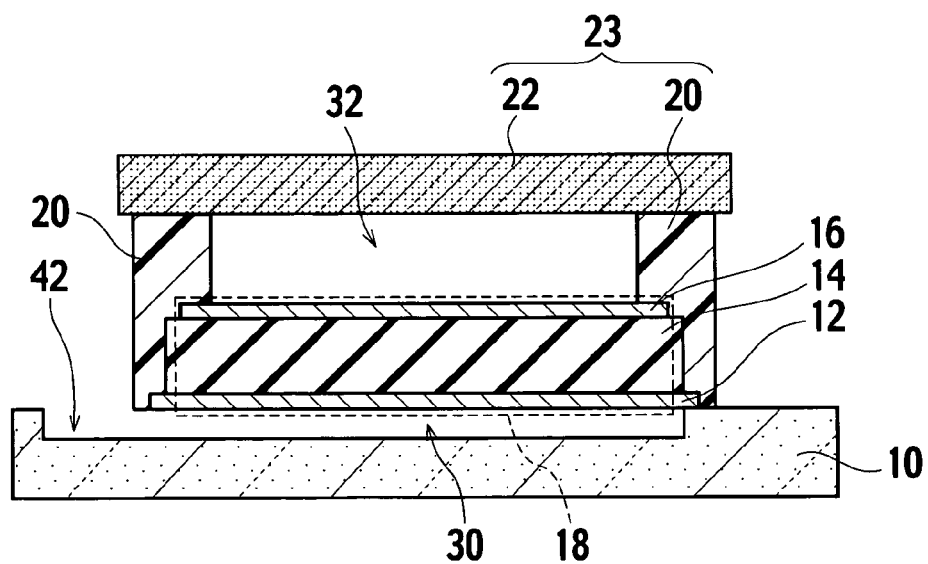
FIG. 3 is cross-sectional view taken on line III-III of the FBAR shown in FIG. 1.

As shown in FIGS. 1 to 3, a FBAR according to a first embodiment of the present invention includes a substrate 10, a bottom electrode 12, a piezoelectric film 14, a top electrode 16, a seal member 23, and the like. The substrate 10 has a cavity 30 in and at a surface of the substrate 10. The bottom electrode 12 is provided on the surface of the substrate 10 so as to extend over the cavity 30. The piezoelectric film 14 is disposed on the bottom electrode 12. The top electrode 16 is disposed on the piezoelectric film 14 so as to face the bottom electrode 12 and extends across the surface of the substrate 10. In the FBAR, a parallel plate capacitor 18 is defined by the bottom electrode 12, the piezoelectric film 14 and the top electrode 16.

The seal member 23 includes a support member 20 and a seal plate 22. The support member 20 is disposed on the substrate 10 so as to surround the capacitor 18. The support member 20 contacts each of the bottom electrode 12, the piezoelectric film 14, and the top electrode 16. The seal plate 22 is disposed on top of the support member 20 so as to form a cavity 32 above the capacitor 18. The seal member 23 is disposed on the cavity 32 so as to cover the capacitor 18. Opening portions 42 of the cavity 30 are located outside of a surrounded region of the support member 20 on the surface of the substrate 10. In the first embodiment of the present invention, four rectangular opening portions 42 are provided at facing ends of the cavity 30 in a direction perpendicular to a direction in which the bottom electrode 12 and the top electrode 16 extend from the capacitor 18, so as to face each other on the surface of the substrate 10.

In the capacitor 18, a high frequency signal is transmitted in the piezoelectric film 14 by the resonance of bulk acoustic waves excited by a high frequency signal applied to the bottom electrode 12 or the top electrode 16. For example, a GHz range high frequency signal that is applied from the bottom electrode 12 is transmitted to the top electrode 16 through the piezoelectric film 14 in the capacitor 18.

In order to achieve a fine resonance characteristic from the capacitor 18, an AlN film or a ZnO film, either of which has an excellent film quality including crystal orientation and uniformity of film thickness, may be used as the piezoelectric film 14. A metal film, such as aluminum (Al), molybdenum (Mo), and tungsten (W), may be used as the bottom electrode 12 and the top electrode 16. The substrate 10 may be a semiconductor substrate, such as a Si substrate. A photosensitive resin, such as polyimide and the like, may be used as the support member 20. A semiconductor substrate, such as a Si substrate, may be used as the seal plate 22.

The FBAR according to the first embodiment of the present invention has a seal structure suspended from the seal plate 22 by the support member 20 contacting the bottom electrode 12 and the top electrode 16 on the surface of the substrate 10. Therefore, it is possible to suppress a decrease in the mechanical strength of the FBAR.

Further, in the FBAR according to the first embodiment, the opening portion 42, which leads into the cavity 30 formed under the capacitor 18, is provided outside the surrounded region of the support member 20. After forming the seal plate 22, it is possible to chemically process a bottom surface of the bottom electrode 12, exposed in the cavity 30, through the opening portions 42. Therefore, it is possible to adjust the FBAR to a desired resonant frequency by adjusting the film thickness of the bottom electrode 12.

Furthermore, in the first embodiment of the present invention, as shown in FIG. 1, four rectangular opening portions 42 are provided at the facing ends of the cavity 30 in the direction perpendicular to the direction in which the bottom electrode 12 and the top electrode 16 extend to face each other. However, opening portions may be provided at the facing ends of the cavity 30 in the direction parallel to the direction in which the bottom electrode 12 and the top electrode 16 extend to face each other. Additionally, a single opening portion, or a plurality of opening portions may be within the scope of the invention. Also, the shape of the opening portions 42 is not limited to a rectangular shape. For example, the opening portions 42 may have an arbitrary shape, such as a circular shape, an ovular shape, and a polygonal shape.

Next, a method for manufacturing a FBAR according to the first embodiment of the present invention will be described with reference to cross-sectional views shown in FIGS. 4 to 13. Here, each of the cross-sectional views used for describing the manufacturing method corresponds to a cross-section taken along the line V-V shown in FIG. 4.

Figure 4:
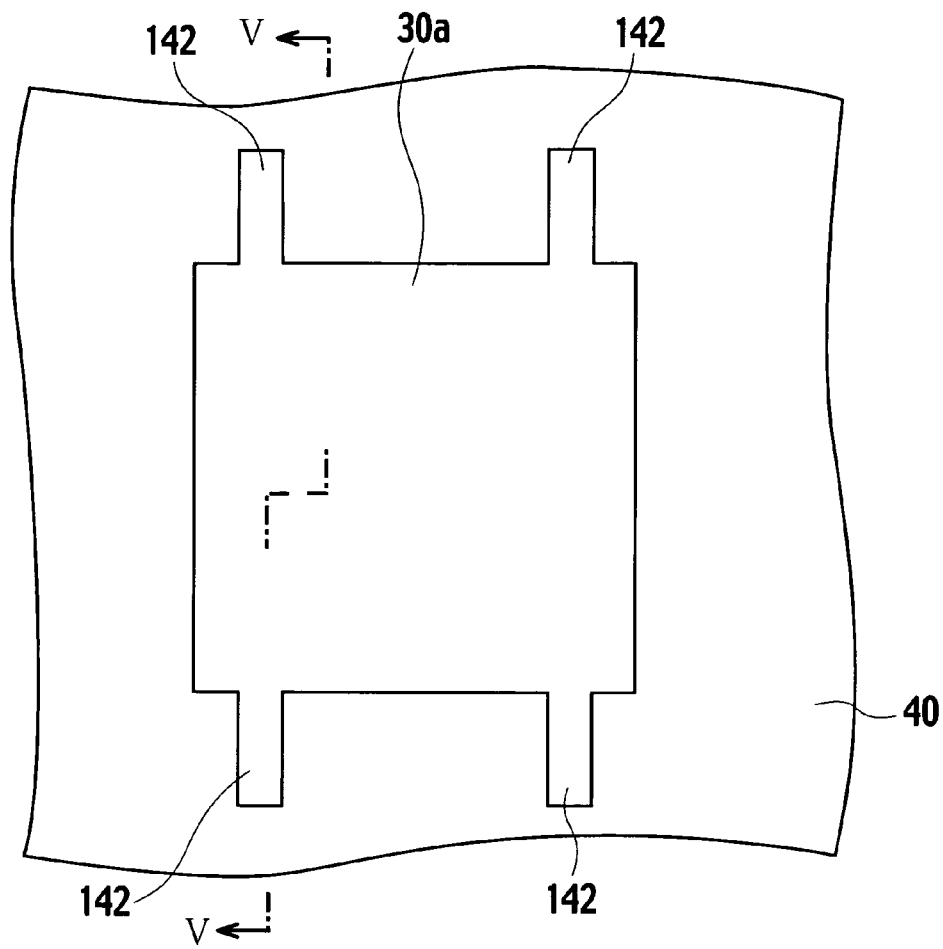
FIGS. 4 to 13 are cross-sectional views showing an example of a method for manufacturing a FBAR according to the first embodiment of the present invention.
Figure 5:
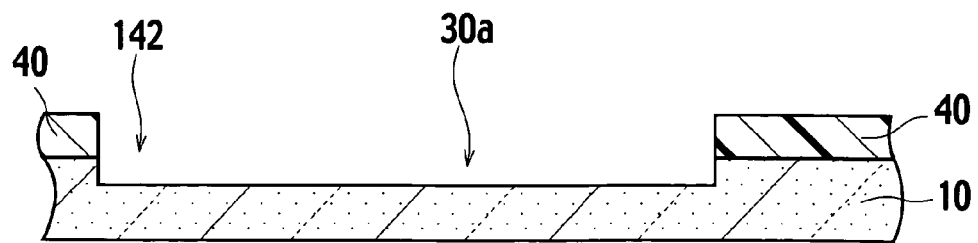

As shown in FIGS. 4 and 5, a resist pattern 40 is delineated on a substrate 10, such as a Si substrate, by photolithography and the like. The substrate 10 is selectively removed by reactive ion etching (RIE) and the like using the resist pattern 40 as a mask to form a groove 30a in and at the surface of the substrate 10. In a plan view shown in FIG. 4, the groove 30a has laterally protruding portions 142.

Figure 6:
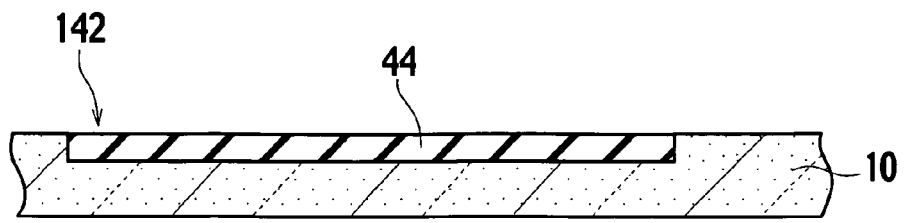

As shown in FIG. 6, a silicon oxide ($SiO_2$) film is deposited on a surface of the substrate 10 so as to fill the groove 30a, by plasma enhanced (PE) chemical vapor deposition (CVD) and the like. A sacrificial film 44 is planarized so that the surface of the substrate 11 is exposed, by chemical mechanical polishing (CMP) and the like.

Figure 7:
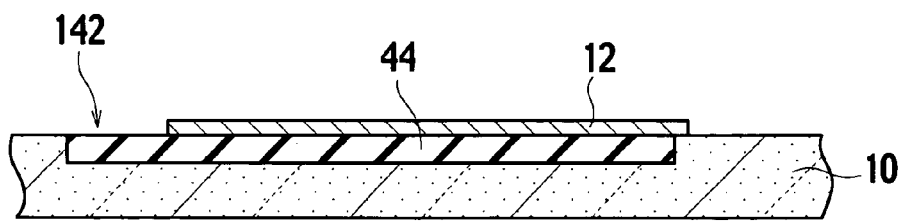

As shown in FIG. 7, a metal film, such as Mo, is deposited on surfaces of the substrate 10 and the sacrificial film 44 with a thickness range from about 150 nm to about 600 nm, desirably with a thickness range from about 250 nm to about 350 nm, by direct-current (DC) magnetron sputtering and the like. The metal film is selectively removed by photolithography, RIE and the like, to delineate a bottom electrode 12 so that a part of each laterally protruding portion 142 is exposed. In addition, although omitted in the drawing, the bottom electrode 12 is formed so as to extend on the sacrificial layer from the substrate 10 in a perpendicular direction of the line V-V, shown in FIG. 4.

Figure 8:
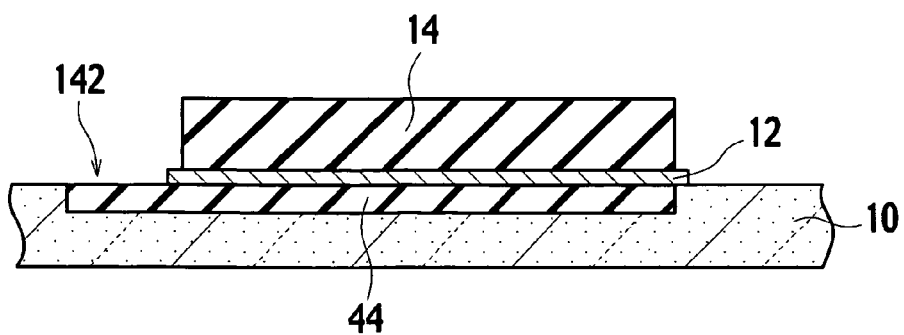

As shown in FIG. 8, a wurtzite-type AlN film is deposited with a thickness of about 0.5 μm to about 3 μm on the surface of the substrate 10 on which the bottom electrode 12 has been formed, by radio frequency (RF) magnetron sputtering and the like. The thickness of the AlN film is determined by a resonance frequency. For example, when the resonance frequency is about 2 GHz, the thickness of the AlN film is about 2 μm. The AlN film is selectively removed by photolithography, RIE using a chloride gas, and the like, to stack a piezoelectric film 14 on the surface of the bottom electrode 12. In addition, although omitted in the drawing, the piezoelectric film 14 is provided so as to cover the exposed surface of the sacrificial film 44, except for the protruding portions 142 in the perpendicular direction of the line V-V, shown in FIG. 4.

Figure 9:
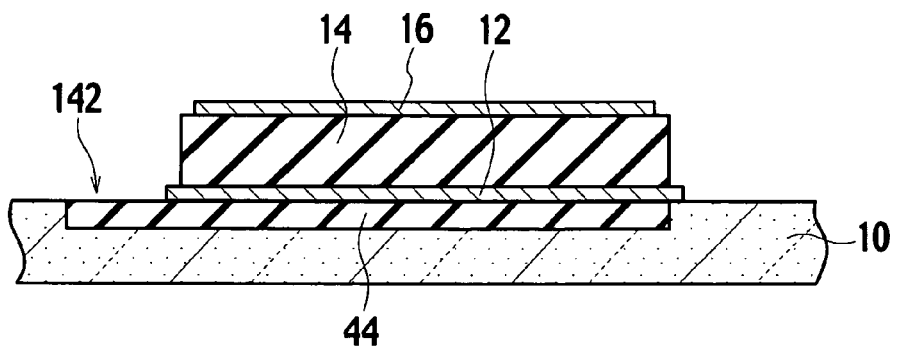

As shown in FIG. 9, a metal film, such as Al, is deposited on the surface of the substrate 10 on which the piezoelectric film 14 has been formed with a thickness range from about 150 nm to about 600 nm, desirably with a thickness range from about 250 nm to about 350 nm by sputtering and the like. The metal film is selectively removed by photolithography, wet etching using a non-oxidizing acid, such as hydrochloric acid, and the like, to delineate a top electrode 16 facing the bottom electrode 12 and sandwiching the piezoelectric film 14 therebetween. In addition, although omitting in the drawing, the top electrode 16 is formed so as to extend on an opposite side of the substrate 10, from the surface of the piezoelectric film 14, in the perpendicular direction of the line V-V, shown in FIG. 4.

Figure 10:
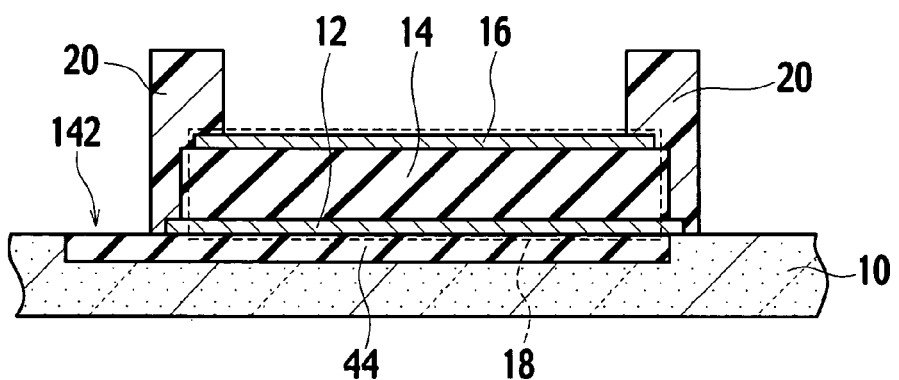

As shown in FIG. 10, a resin film, such as a photosensitive resin, is spin-coated on the surface of the substrate 10 on which the top electrode 16 has been formed. The resin film has a thickness from about 5 μm to about 20 μm, more specifically a thickness of about 10 μm, for example. A portion of the resin film, which is selectively cross-linked by photolithography and the like, is retained to form a support member 20 so as to surround the capacitor 18, which is defined in a region where the bottom electrode 12 and the top electrode 16 face each other. The portions of the sacrificial film 44 are exposed at the protruding portions 142 located outside the surrounded region of the support member 20.

Figure 11:
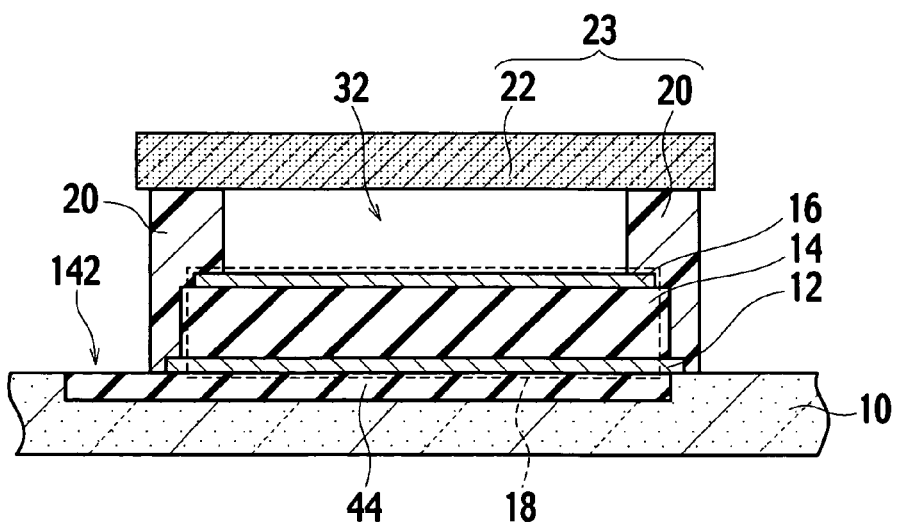

As shown in FIG. 11, a seal plate 22, such as a Si substrate, having a thickness of about 100 μm is placed on the supporting member 22. A thermosetting resin, such as epoxy resin, having a thickness of about 1 μm is coated on the sealing plate 24. The seal plate 22 is attached to the supporting member 22 by heating to seal the capacitor 18 and to form a seal member 23. A cavity 32 surrounded by the seal member 23 including the support member 20 and the seal plate 22 is formed above the top electrode 16 in the capacitor 18.

Figure 12:
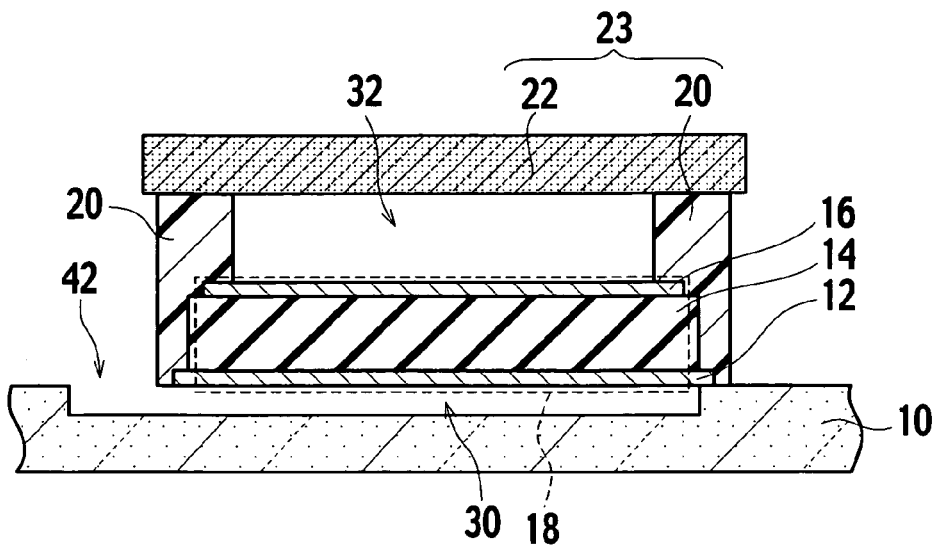

As shown in FIG. 12, the sacrificial film 44 is selectively removed through the exposed protruding portions 142 by wet etching using a hydrofluoric acid (HF) solution, to form a cavity 30 below the bottom electrode 12. Opening portions 42 of the cavity 30 are formed corresponding to the protruding portions 142 of the sacrificial film 44.

After forming the cavities 30 and 32, a resonance frequency of the FBAR is measured. When the measured resonance frequency is less than a desired resonance frequency, a film thickness of the bottom electrode 12 is decreased, by etching with a chlorine (Cl) containing gas and the like, through the opening portions 42. At this time, it is possible to very accurately decrease the film thickness of the bottom electrode 12 by adjusting the temperature of the bottom electrode 12 while irradiating with an infrared light and the like. By reducing the weight of the bottom electrode 12, the resonance frequency is shifted to a higher frequency. Thus, the desired resonance frequency can be achieved. On the contrary, when the measured resonance frequency is higher than the desired resonance frequency, the film thickness of the bottom electrode 12 is increased, by plating with a copper (Cu) plating solution and the like, through the opening portions 42. The weight of the bottom electrode 12 is increased by plating, and the resonance frequency is shifted to a lower frequency. Thus, the desired resonance frequency can be achieved.

Figure 13:
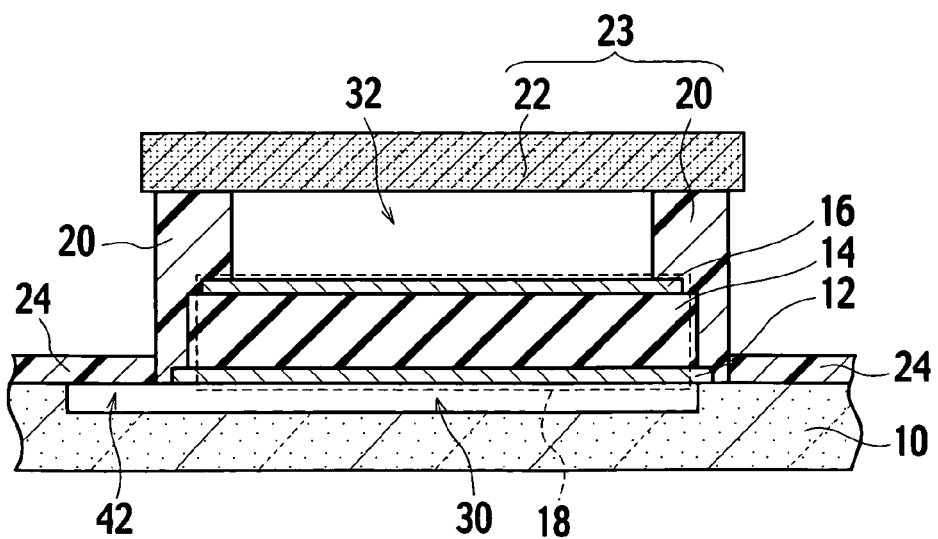

As shown in FIG. 13, a resin film 24, such as epoxy resin, is provided on the opening portions 42 so as to seal the cavity 30. Thus, the FBAR according to the first embodiment of the present invention is manufactured.

In the first embodiment, the sealing process in which the seal plate 22 is attached to the support member 20 is executed before forming the cavity 30 below the bottom electrode 12. Therefore, it is possible to prevent collapse of the cavity 30, caused by the thermal load or weight load applied during the sealing process.

Also, the opening portions 42 extending from the cavity 30 are provided outside of a surrounded region of the support member 20 surrounding the cavity 32. It is possible to adjust the resonant frequency of the FBAR by chemically processing the bottom electrode 12 through the opening portions 42 after the sealing process. As a result, it is possible to avoid a variation of the resonant frequency caused by the sealing process and the like, and to adjust the resonant frequency with high accuracy.

Thus, in the manufacturing method of the FBAR according to the first embodiment of the present invention, it is possible to prevent collapse of the cavity 30, as well as performing highly accurate adjustment of the resonant frequency. As a result, it is possible to suppress a decrease in the manufacturing yield of the FBAR.

Also, in the first embodiment of the present invention, the metal film, such as Mo, is used as the bottom electrode 12. However, the bottom electrode 12 is not limited to Mo. For example, a metal film, such as Al, may be used as the bottom electrode 12. In a case using Al as the bottom electrode 12, it is desirable to insert an acid resistant insulating film, such as alumina ($Al_2O_3$), with a thickness of about 50 nm between the bottom electrode 12 and the substrate 10.

Also, the $SiO_2$ film deposited by PECVD is used as the sacrificial film 44. However, the sacrificial film 44 is not limited to $SiO_2$. It is possible to use a $SiO_2$ film deposited by CVD, a silicon nitride ($Si_3N_4$) film, a phosphosilicate glass (PSG) film, a borophosphosilicate glass (BPSG) film, a spin on glass (SOG) film, a spin on dielectric (SOD) film, a carbon (C) film, a polymide film, a resist film, and the like, for the sacrificial film 44. For example, in a case using a resist film and the like for the sacrificial layer 44, it is desirable to deposit the bottom electrode 12, the piezoelectric film 14, and the top electrode 16 at a temperature of about 200° C. or less.

Second Embodiment

Figure 14:
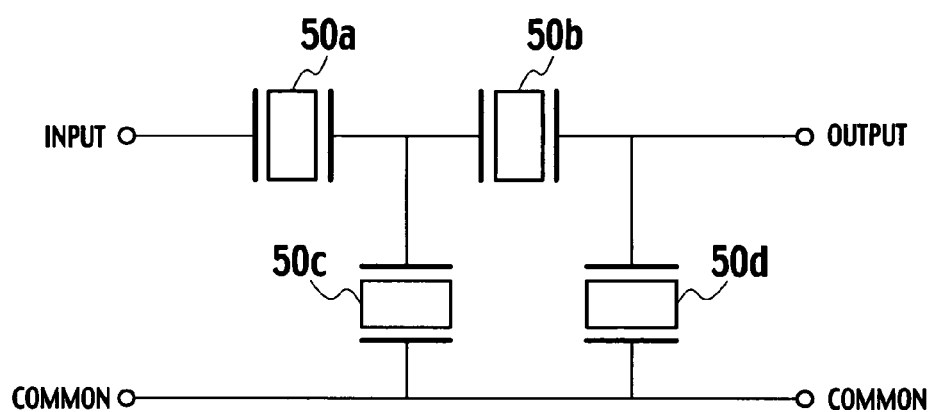
FIG. 14 is a block diagram showing an example of a filter circuit according to a second embodiment of the present invention.

A plurality of FBARs according to a second embodiment of the present invention can be used in an application to a high frequency circuit, such as a filter and a voltage control oscillator. As shown in FIG. 14, a plurality of FBARs 50a, 50b, 50c, and 50d interconnected in a ladder-type structure are used in a filter circuit. The FBARs 50a and 50b are interconnected in series from an input port to an output port of the filter circuit. The FBARs 50c and 50d are interconnected in parallel from the output sides of the FBAR 50a and 50b to a common port, respectively.

Figure 15:
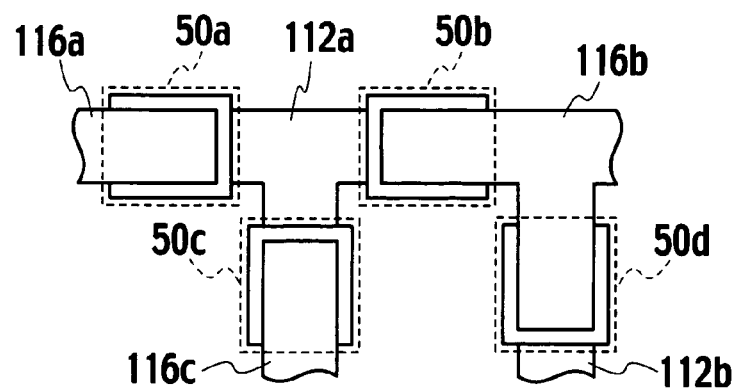
FIG. 15 is a block diagram showing an example of the connection of FBARs used in a filter circuit according to the second embodiment of the present invention.
Figure 16:
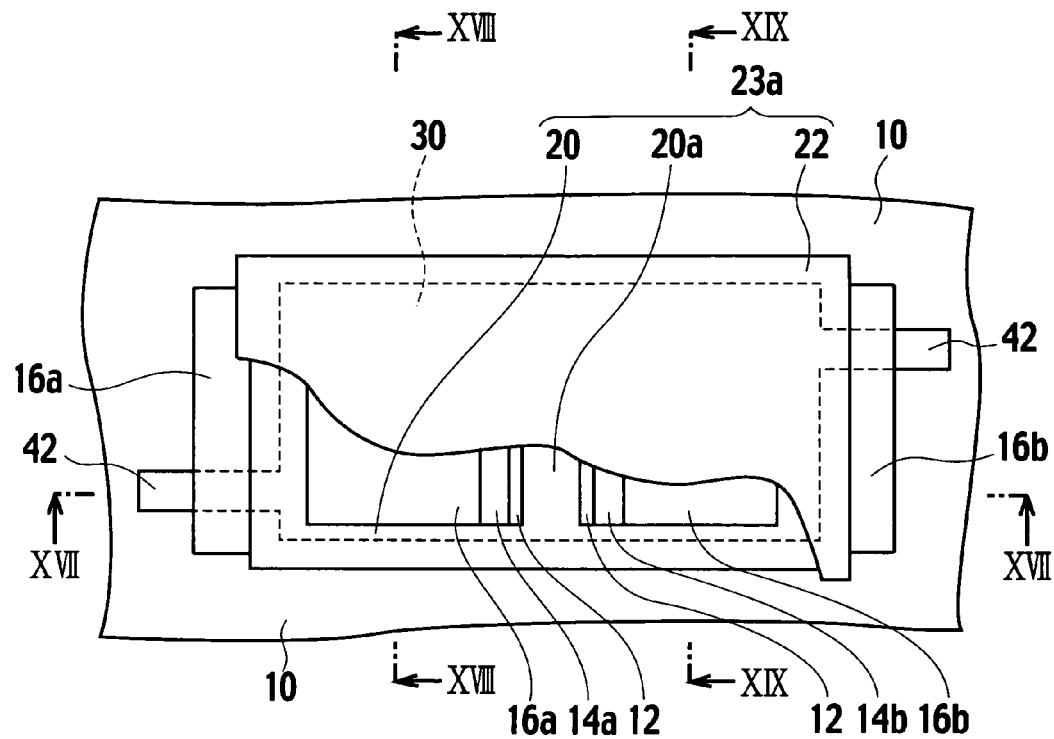
FIG. 16 is a plan view showing an example of FBARs according to the second embodiment of the present invention.

As shown in FIG. 15, the FBARs 50a, 50b, and 50c are interconnected using a common bottom electrode 112a. The FBARs 50b and 50d are interconnected using a common top electrode 116b. A top electrode 116a of the FBAR 50a is connected to the input port of the filter circuit. The top electrode 116b is connected to the output port of the filter circuit. A top electrode 116c of the FBAR 50c and a bottom electrode 112b of the FBAR 50b are connected to the common port.

An example of interconnecting two FBARs will be described. As shown in FIGS. 16 to 19, FBARs of the second embodiment of the present invention include a first capacitor 18a and a second capacitor 18b coupled by the bottom electrode 12. The first and second capacitors 18a, 18b have separated piezoelectric films 14a, 14b, respectively. A top electrode 16a, which faces the bottom electrode 12 to sandwich a piezoelectric film 14a, is provided in the first capacitor 18a. A top electrode 16b, which faces the bottom electrode 12 to sandwich a piezoelectric film 14b, is provided in the second capacitor 18b.

The cavity 30 is provided below the bottom electrode 12. Cavities 32a and 32b are respectively defined by a seal member 23a provided on the substrate 10. The seal member 23a includes support members 20 and 20a, which separately surround the first and second capacitors 18a, 18b therein, and a seal plate 22 which seals the first and second capacitors 18a, 18b. The support member 20 is provided to surround a region that includes the first and second capacitors 18a, 18b. The support member 20 is provided between the first and second capacitors 18a, 18b so as to contact the bottom electrode 12. Opening portions 42 that lead to the cavity 30 are located outside the surrounded region of the support member 20, on the end portions of the top electrodes 16a, 16b in a direction in which the top electrodes 16a, 16b extend.

The second embodiment of the present invention is different from the first embodiment in that the first and second capacitors 18a, 18b of the FBARs are positioned to be coupled by the bottom electrode 12. Other configurations are as in the first embodiment, and thus duplicated descriptions are omitted.

In the FBAR according to the second embodiment of the present invention, the opening portions 42 that lead to the cavity 30 formed under the first and second capacitors 18a, 18b are provided outside the surrounded region of the support member 20. Therefore, it is possible to chemically process the bottom surface of the bottom electrode 12, which is exposed in the cavity 30, through the opening portions 42 after forming the seal member 23a. Therefore, it is possible to adjust the resonant frequency of the first and second capacitors 18a and 18b to a desired frequency by adjusting the film thickness of the bottom electrode 12.

Also, in the plurality of FBARs provided on the cavity 30, the bottom electrode 12 and the top electrodes 16a, 16b are suspended from the seal plate 22 by the support members 20 and 20a. Therefore, it is possible to prevent collapse of the cavity 30 and to adjust the resonant frequency, even if the cavity 30 is extended over a region below the plurality of FBARs.

Next, a method for manufacturing a FBAR according to the second embodiment of the present invention will be described with reference to cross-sectional views shown in FIGS. 20 to 23. Here, each of the cross-sectional views used for describing the manufacturing method corresponds to a cross-section taken along the line XVII-XVII shown in FIG. 16.

Figure 20:
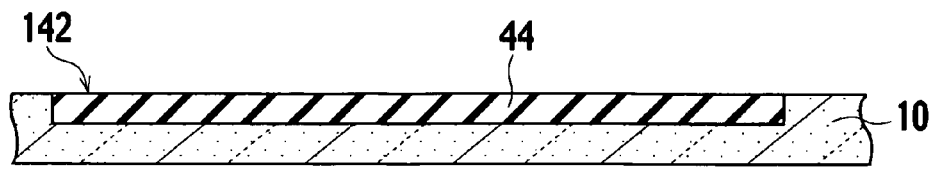
FIGS. 20 to 23 are cross-sectional views showing an example of a method for manufacturing a FBAR according to the second embodiment of the present invention.

As shown in FIG. 20, a groove 30a having protruding portions 142 is formed in a substrate 10, such as a Si substrate, by photolithography, RIE and the like. A sacrificial film 44 embedded in the groove in the substrate 10 is formed by PECVD, CMP and the like.

Figure 21:
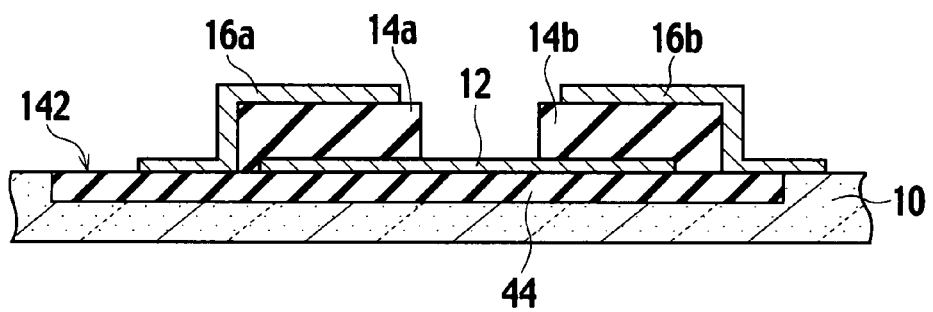

As shown in FIG. 21, a bottom electrode 12, such as Mo, is formed by DC magnetron sputtering, photolithography, RIE and the like on surfaces of the substrate 10 and the sacrificial film 44 with a thickness in a range from about 250 nm to about 300 nm. Piezoelectric films 14a, 14b, such as AlN, are formed by RF magnetron sputtering, photolithography, RIE and the like on the bottom electrode 12 with a thickness of about 2 μm. Top electrodes 16a, 16b, such as Al, are formed by sputtering, photolithography, etching and the like on the piezoelectric films 14a, 14b with a thickness of about 250 nm.

Figure 22:
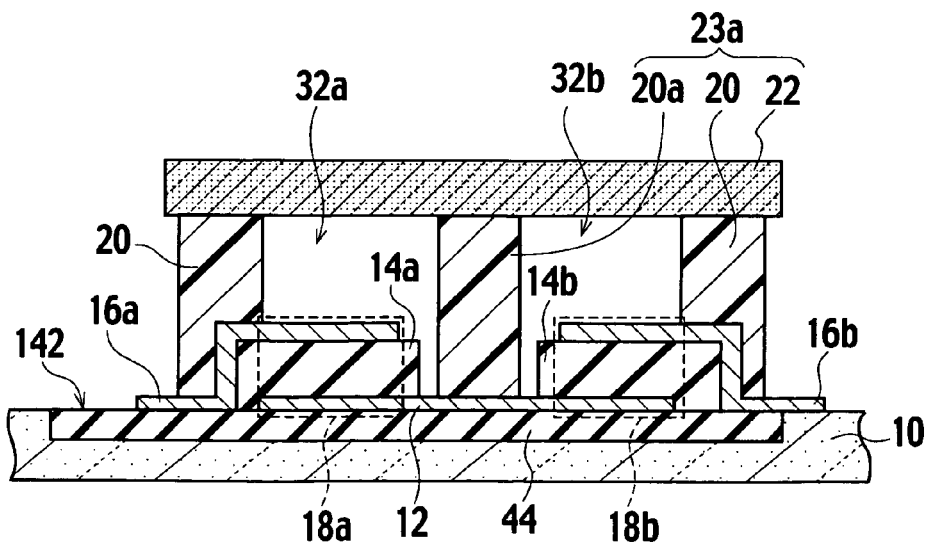

As shown in FIG. 22, a resin film, such as a photosensitive resin, is spin-coated on the surface of the substrate 10 with a thickness of about 10 μm. A portion of the resin film, which is selectively cross-linked by photolithography and the like, is retained to form support members 20, 20a so as to surround each of the capacitors 18a, 18b, which are defined in regions where the bottom electrode 12 and the top electrodes 16a, 16b face each other. A seal plate 22, such as a Si substrate, having a thickness of about 100 μm is attached to the supporting members 22, 22a by heating to form a seal member 23a. Cavities 32a, 32b surrounded by the seal member 23a including the support members 20, 20a and the seal plate 22 are formed above the top electrodes 16a, 16b in the capacitors 18a, 18b, respectively.

Figure 23:
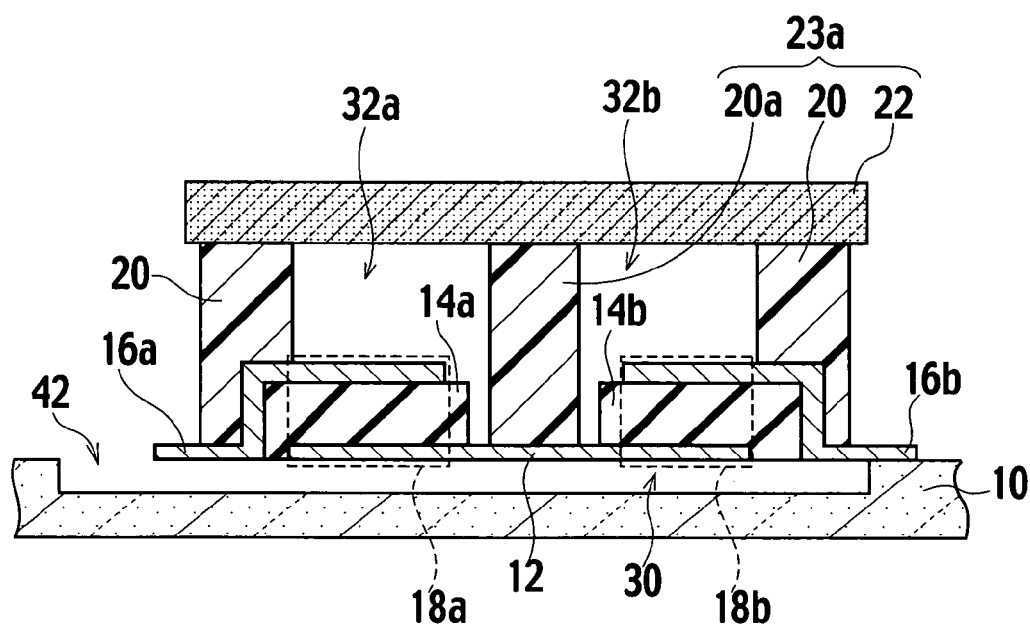

As shown in FIG. 23, the sacrificial film 44 is selectively removed through the exposed protruding portions 142 by wet etching using a HF solution, to form a cavity 30 below the bottom electrode 12. Opening portions 42 of the cavity 30 are formed to correspond to the protruding portions 142 of the sacrificial film 44.

In the second embodiment, after the sealing process in which the seal plate 22 is attached to the support members 20, 20a, the cavity 30 having the opening portions 42 is formed. Therefore, it is possible to prevent collapse of the cavity 30 due to the thermal load or weight load applied during the sealing process. Also, it is possible to adjust the resonant frequency of the FBAR by adjusting the thickness of the bottom electrode 12, using the opening portions 42 after the sealing process. In this manner, according to the FBAR manufacturing method of the second embodiment, it is possible to suppress a decrease in a manufacturing yield of the FBAR.

Figure 17:
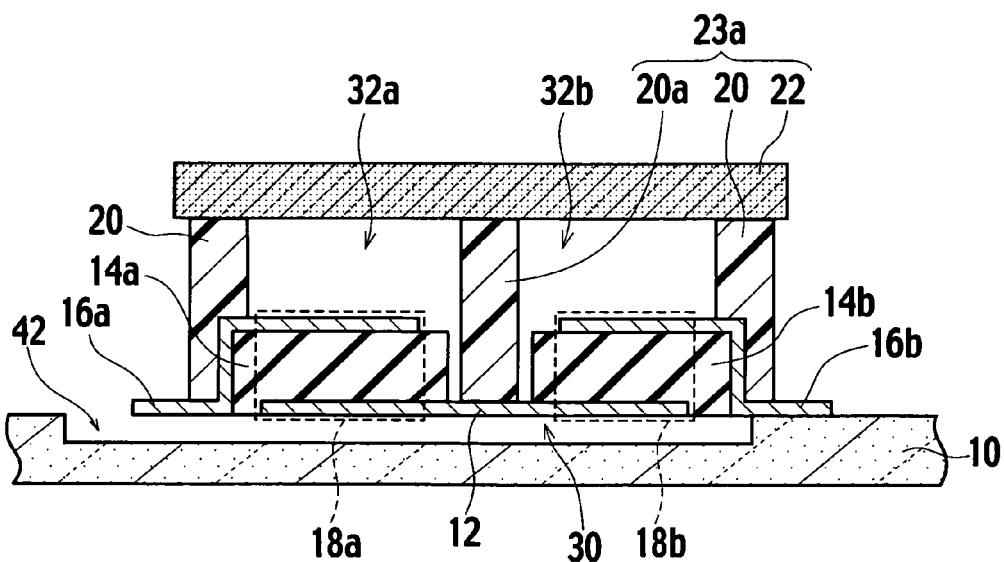
FIG. 17 is cross-sectional view taken on line XVI-XVI of the FBAR shown in FIG. 16.
Figure 18:
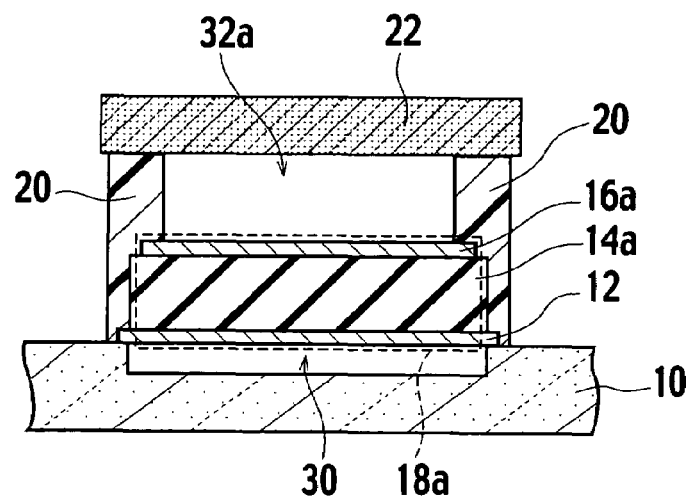
FIG. 18 is cross-sectional view taken on line XVII-XVII of the FBAR shown in FIG. 16.
Figure 19:
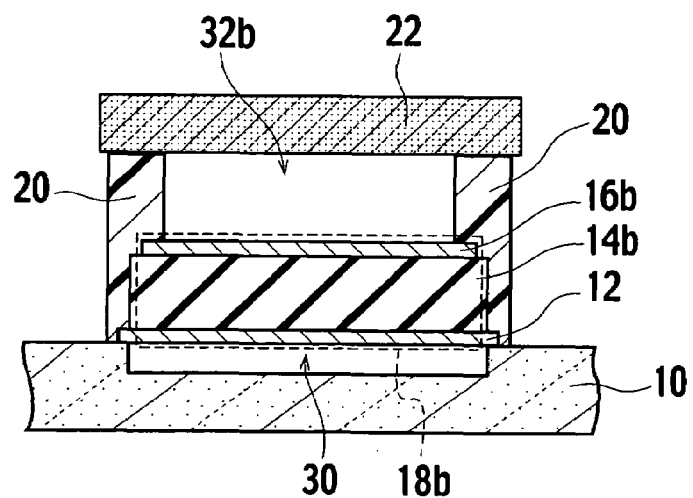
FIG. 19 is cross-sectional view taken on line XVIII-XVIII of the FBAR shown in FIG. 16.
Figure 24:
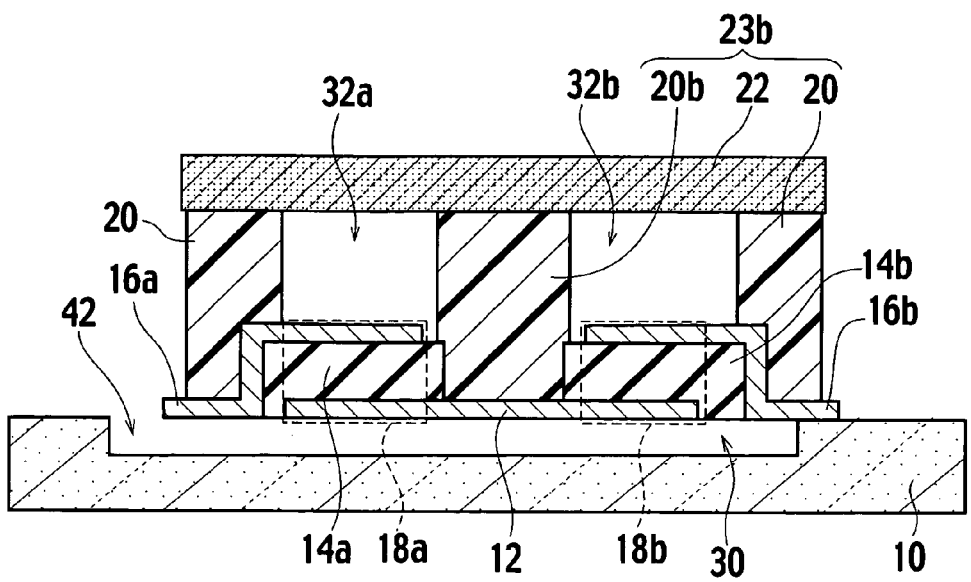
FIG. 24 is a cross sectional view showing another example of FBARs according to the second embodiment of the present invention.

Moreover, as shown in FIG. 17, the support member 20a, disposed between the first and second capacitors 18a, 18b, is provided on top of the bottom electrode 12 and apart from piezoelectric films 14a, 14b. However, the support member is not so limited. As shown in FIG. 24, a support member 20b of a seal member 23b may be disposed on the bottom electrode 12 and contact the piezoelectric films 14a, 14b between the first and second capacitors 18a, 18b. By disposing the support member 20b astride the piezoelectric films 14a, 14b, mechanical strength is increased for suspension by the seal plate 22 using the support members 20, 20a.

Figure 25:
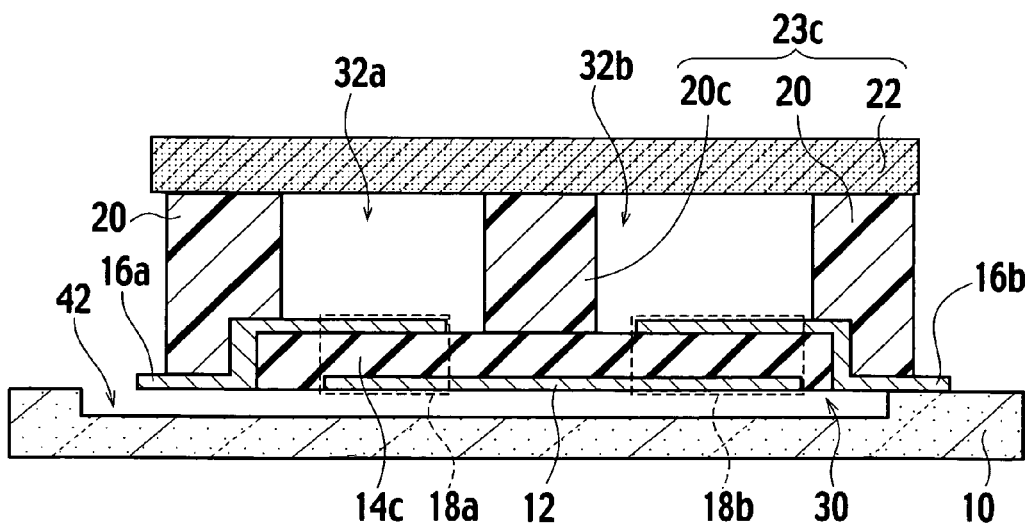
FIG. 25 is a cross sectional view showing still another example of FBARs according to the second embodiment of the present invention.

Also, as shown in FIG. 25, a common piezoelectric film 14c shared by the first and second capacitors 18a, 18b may be used. A support member 20c of a seal member 23c is disposed on a surface of the piezoelectric film 14c on the bottom electrode 12. Therefore, mechanical strength for suspension by the seal plate 22 using the support members 20, 20c is increased even further.

Figure 26:
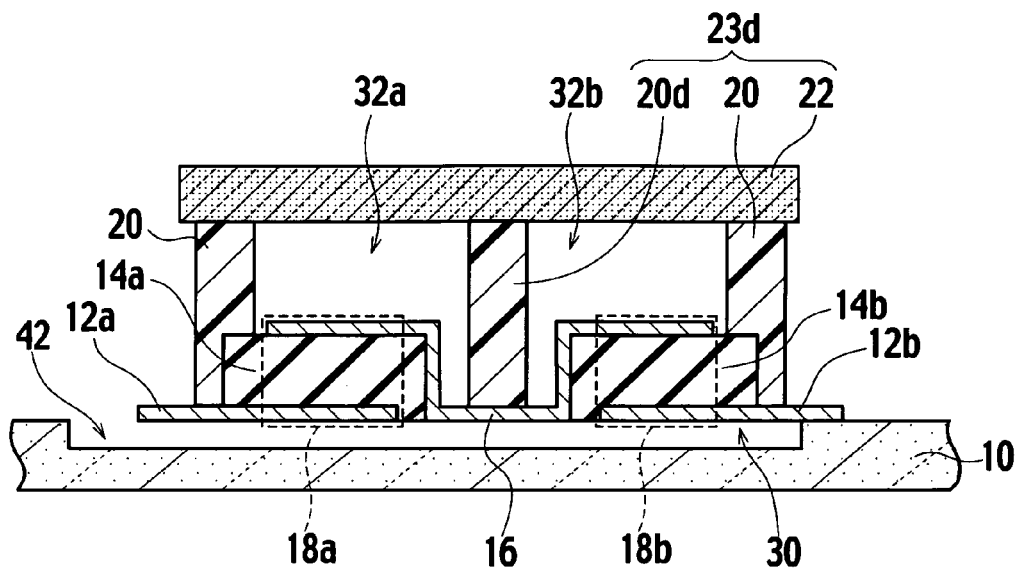
FIG. 26 is a cross sectional view showing still another example of FBARs according to the second embodiment of the present invention.

Also, in the above description, the first and second capacitors 18a, 18b are described as being electrically connected together using the common bottom electrode 12. However, as shown in FIG. 26, the first and second capacitors 18a, 18b may be connected together using the common top electrode 16. In the first and second capacitors 18a, 18b, bottom electrodes 12a and 12b are disposed so as to face the top electrode 16 to sandwich the piezoelectric films 14a, 14b, respectively. A support member 20d of a seal member 23d is disposed on a surface of the top electrode 16 defining the cavity 30.

Figure 27:
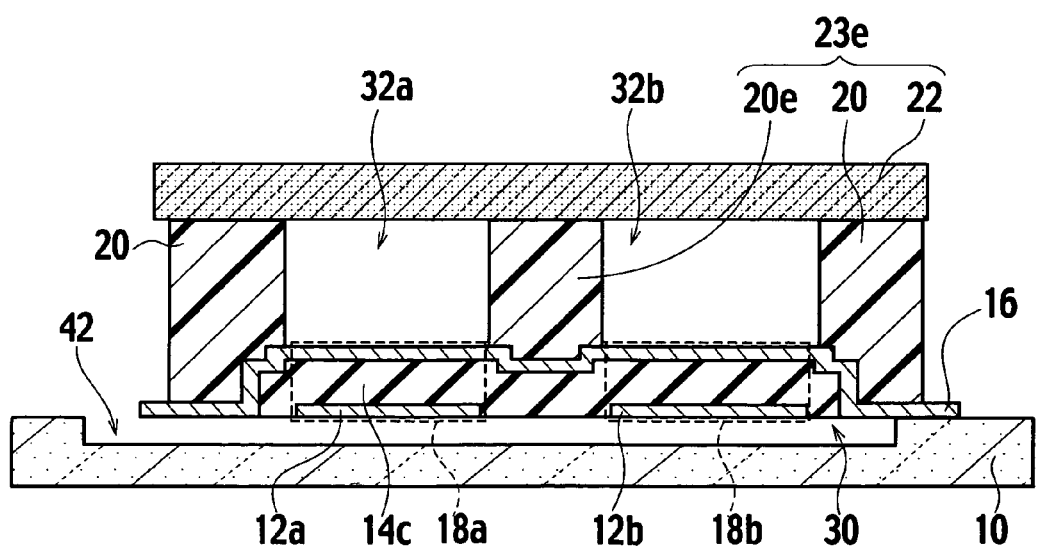
FIG. 27 is a cross sectional view showing still another example of FBARs according to the second embodiment of the present invention.

Furthermore, as shown in FIG. 27, the common piezoelectric film 14c and the common top electrode 16 shared by the first and second capacitors 18a, 18b may be used. In such a case, a support member 20e of a seal member 20e may be disposed in a region corresponding to step portions of the piezoelectric film 14c between the first and second capacitors 18a, 18b. Here, in the step portions of the piezoelectric film 14c, which are formed by CVD of the piezoelectric film 14c on the bottom electrode 12a, 12b, damage of the piezoelectric film 14c may occur due to a non-uniform crystal orientation. Therefore, support of the step portions of the piezoelectric film 14c, using the support member 20e, is extremely effective in achieving an increase in mechanical strength for suspension by the seal plate 22 using the support members 20, 20e.

Other Embodiments

In the first and second embodiments of the present invention, the support member 20 is provided so as to be located on a periphery of the piezoelectric films 14, 14a, or 14b. However, the support member 20 may be disposed apart from the piezoelectric films 14, 14a, and 14b.

The present invention has been described as mentioned above. However the descriptions and drawings that constitute a portion of this disclosure should not be perceived as limiting this invention. Various alternative embodiments and operational techniques will become clear to persons skilled in the art from this disclosure.

What is claimed is:

1. A film bulk acoustic resonator, comprising:
    a substrate having a cavity at a surface of the substrate;
    a bottom electrode provided on the surface of the substrate so as to extend over the cavity;
    a piezoelectric film disposed on the bottom electrode;
    a top electrode disposed on the piezoelectric film so as to face the bottom electrode and extending over the surface of the substrate; and
    a seal member configured to seal a capacitor defined by the bottom electrode, the piezoelectric film and the top electrode, and to provide an opening portion of the cavity outside the seal member at the surface of the substrate.

2. The film bulk acoustic resonator of claim 1, wherein the seal member is connected to the bottom electrode and the top electrode.

3. The film bulk acoustic resonator of claim 1, wherein the seal member is connected to the piezoelectric film.

4. The film bulk acoustic resonator of claim 1, wherein the seal member comprises:
    a support member surrounding the capacitor; and
    a seal plate disposed on the support member above the capacitor.

5. The film bulk acoustic resonator of claim 4, wherein the support member includes a resin.

6. The film bulk acoustic resonator of claim 4, wherein the seal plate includes a silicon substrate.

7. A filter circuit using a plurality of electrically connected film bulk acoustic resonators on a substrate, each of the film bulk acoustic resonators comprising:
    a bottom electrode provided on a surface of the substrate having a cavity at the surface of the substrate so as to extend over the cavity;
    a piezoelectric film disposed on the bottom electrode;
    a top electrode disposed on the piezoelectric film so as to face the bottom electrode and extending over the surface of the substrate; and
    a seal member configured to seal a capacitor defined by the bottom electrode, the piezoelectric film and the top electrode, and to provide an opening portion of the cavity outside the seal member at the surface of the substrate.

8. The filter circuit of claim 7, wherein the seal member is connected to the bottom electrode and the top electrode.

9. The filter circuit of claim 7, wherein the seal member is connected to the piezoelectric film.

10. The filter circuit of claim 7, wherein the seal member comprises:
    a support member surrounding each of a plurality of capacitors of the film bulk acoustic resonators; and
    a seal plate disposed on the support member above the capacitors.

11. The filter circuit of claim 7, wherein the capacitor of each of the film bulk acoustic resonators shares the cavity.

12. The filter circuit of claim 7, wherein the capacitor of each of the film bulk acoustic resonators includes a separate piezoelectric film.

13. The filter circuit of claim 7, wherein each of a plurality of capacitors of the film bulk acoustic resonators shares the piezoelectric film.

14. The filter circuit of claim 10, wherein the support member includes a resin.

15. The filter circuit of claim 10, wherein the seal plate includes a silicon substrate.

16. A method for manufacturing a film bulk acoustic resonator, comprising:
- selectively forming a sacrificial film in and at a surface of a substrate;
- delineating a bottom electrode on the surface of the substrate so as to extend over the sacrificial film;
- delineating a piezoelectric film on the bottom electrode;
- delineating a top electrode on the piezoelectric film so that a part of the top electrode faces the bottom electrode and another part of the top electrode extends over the surface of the substrate;
- forming a support member on the substrate so as to surround a capacitor defined by the bottom electrode, the piezoelectric film and the top electrode and to locate a portion of the sacrificial film outside a surrounded region of the support member;
- attaching a seal plate on the support member above the capacitor so as to seal the capacitor; and
- forming a cavity at the surface of the substrate by removing the sacrificial film through the portion of the sacrificial film located outside the surrounded region of the support member.

17. The method of claim 15, wherein the support member is connected to the bottom electrode and the top electrode.

18. The method of claim 15, wherein the support member is connected to the piezoelectric film.

19. The method of claim 15, wherein the support member includes a resin.

20. The method of claim 15, wherein the seal plate includes a silicon substrate.

* * * * *